(12) United States Patent
Wirz

(10) Patent No.: US 7,471,035 B2
(45) Date of Patent: Dec. 30, 2008

(54) INTERNAL CONDUCTIVELY-HEATED CATHODE

(75) Inventor: Richard Wirz, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 617 days.

(21) Appl. No.: 10/924,737

(22) Filed: Aug. 23, 2004

(65) Prior Publication Data

US 2005/0082960 A1 Apr. 21, 2005

Related U.S. Application Data

(60) Provisional application No. 60/497,357, filed on Aug. 21, 2003.

(51) Int. Cl.
*H01J 9/02* (2006.01)
(52) U.S. Cl. ..................... 313/310; 313/341
(58) Field of Classification Search ............. 313/310, 313/341
See application file for complete search history.

(56) References Cited

U.S. PATENT DOCUMENTS

| | | | | |
|---|---|---|---|---|
| 2,996,643 A | * | 8/1961 | Frederick et al. ............ | 315/105 |
| 4,795,940 A | * | 1/1989 | Leung et al. ............ | 313/346 R |
| RE32,918 E | * | 5/1989 | Cann ........................ | 60/203.1 |
| 4,994,706 A | * | 2/1991 | Leung et al. ................. | 313/30 |
| 5,015,908 A | * | 5/1991 | Miram et al. ................ | 313/37 |

OTHER PUBLICATIONS

Wirz R., et al. "Miniature Ion Thrusters for Precision Formation Flying," AIAA-2004-4115, 40th Joint Propulsion Conference & Exhibit, Jul. 2004, Fort Lauderdale, FL.
Wirz R., et al., "Development of Cathode Technologies for a miniature Ion Thruster," 39th AIAA/ASME/SAE/ASEE Joint Propulsion Conference & Exhibit, Jul. 20-23, 2003, Huntsville, Alabama.
http://www.kimphys.com/cathode/cath_prod.htm.
http://www.a-p-tech.com/docs/Webbrochure.pdf.
http://www.laddresearch.com/General_Catalog/Chapter_3/LaB6_Cathode/lab6_cathode.html.
Wirz R., Polk J., Marrese C., Mueller J., "Development and Testing of a 3cm Electron Bombardment Micro-Ion Thruster," IEPC Paper 01-343, 27th IEPC, Pasadena, CA, Oct. 2001.
Wirz R., Polk J., Marrese C., Mueller J., "Experimental and Computational Investigation of the Performance of a Micro-Ion Thruster," AIAA-2002-3835, 38th JPC, Indianapolis, IN, Jul. 2002.
Domonkos M., "An Evaluation of Hollow Cathode Scaling to Very Low Power and Flow Rate," IEPC-97-189.
Domonkos M., "Low-Current Hollow Cathode Evaluation," AIAA-99-2575.

* cited by examiner

*Primary Examiner*—Joseph L Williams
*Assistant Examiner*—Bumsuk Won
(74) *Attorney, Agent, or Firm*—Tope-McKay & Associates

(57) ABSTRACT

The present invention relates to an internally heated cathode. More specifically, the internally heated cathode that comprises an a cavity structure, where at least a portion of the cavity structure forms an emission material portion, the cavity structure defining a cavity, and a heater disposed within the cavity, providing for an efficient, durable, and long lasting cathode that requires less power.

47 Claims, 17 Drawing Sheets

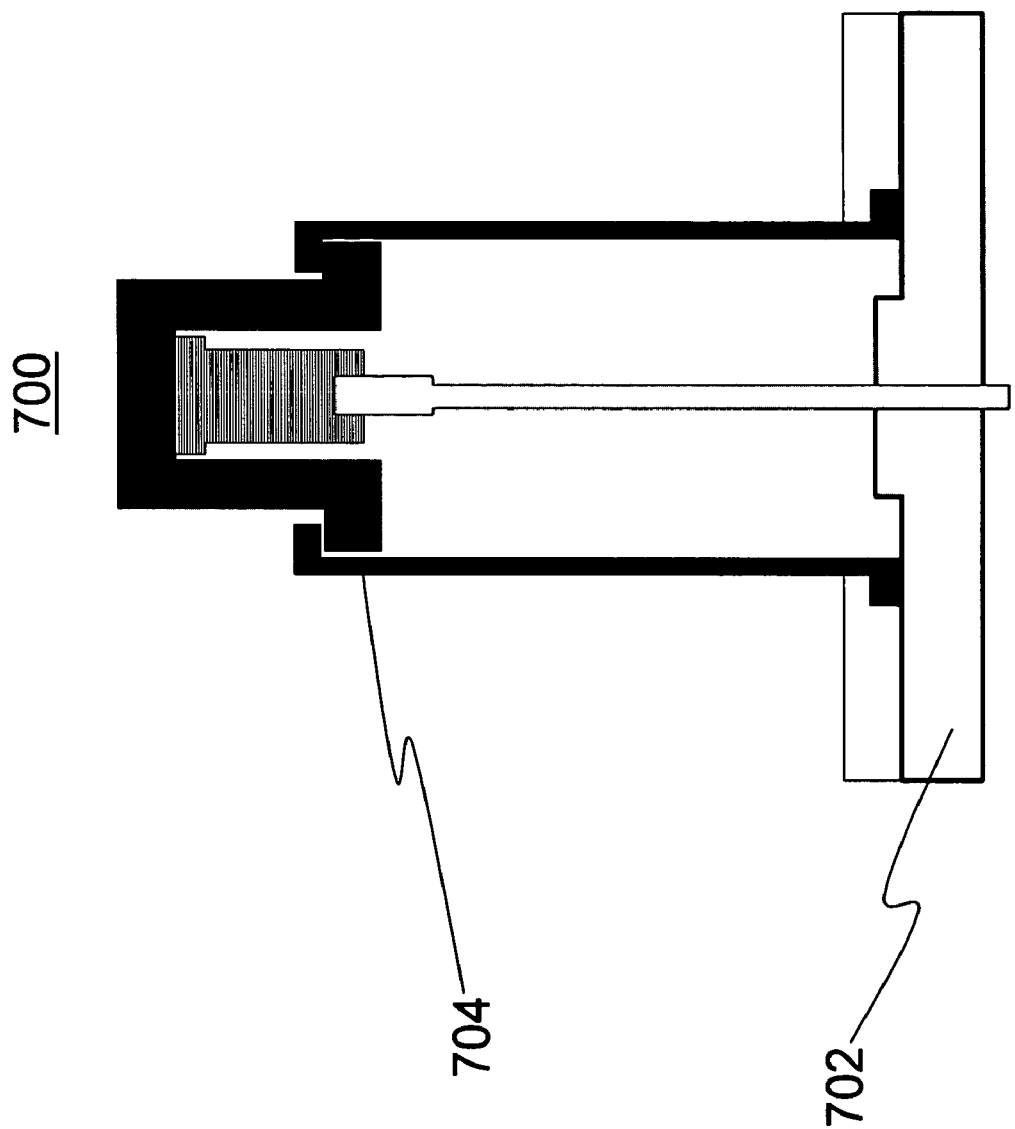

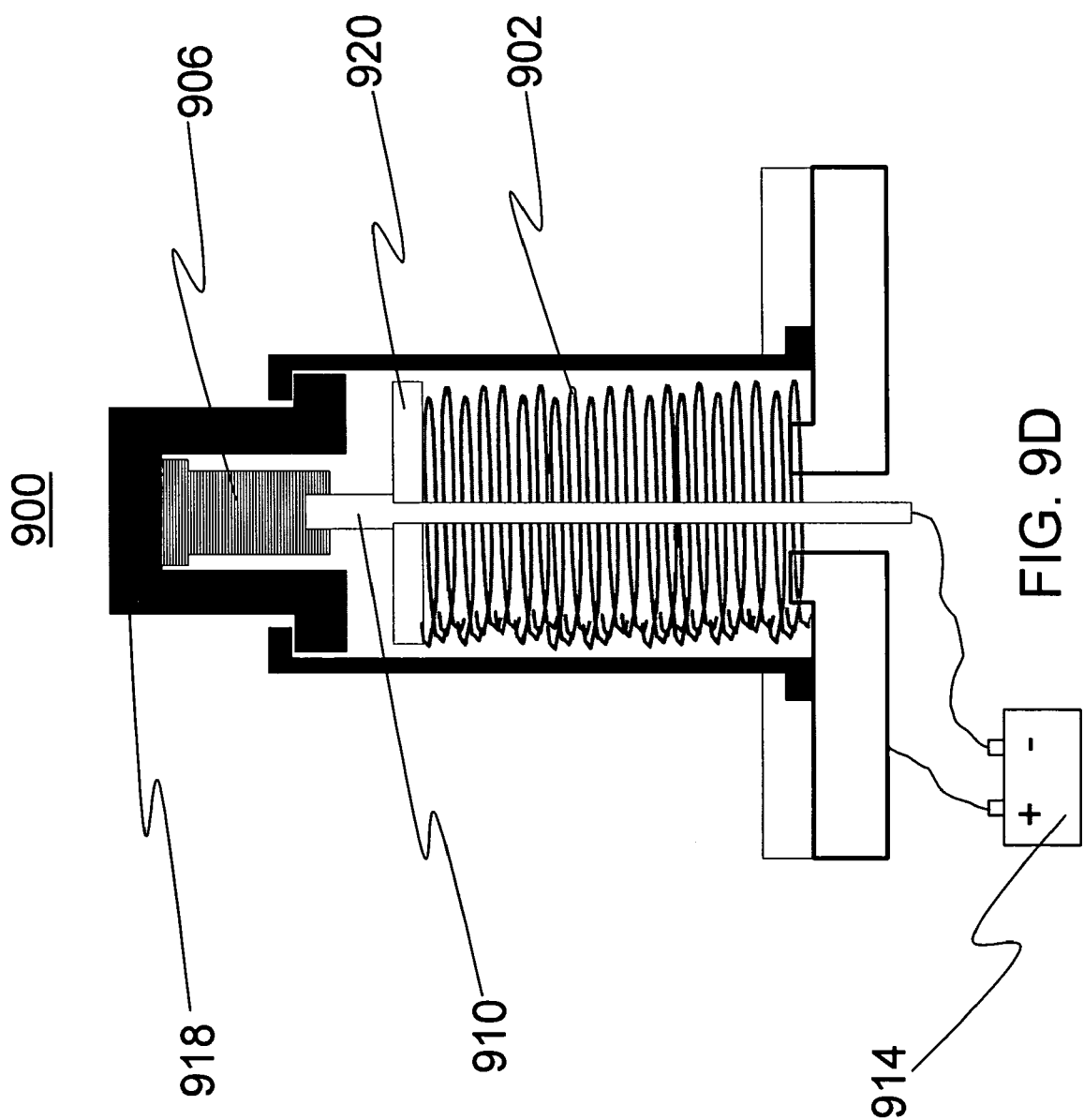

INTERNAL CONDUCTIVELY-HEATED CATHODE

PRIORITY CLAIM

The present application claims the benefit of priority of U.S. Provisional Patent Application No. 60/497,357, filed Aug. 21, 2003, entitled "Internal Conduction Heated High Temperature Cathode Emitter."

BACKGROUND OF THE INVENTION (1) Technical Field

The present invention relates to an internally heated cathode. More specifically, the internally heated cathode that comprises an a cavity structure, where at least a portion of the cavity structure forms an emission material portion, the cavity structure defining a cavity, and a heater disposed within the cavity, providing for an efficient, durable, and long lasting cathode that requires less power.

(2) Description of Related Art

Cathodes have a variety of applications in the art, including, but not limited to: generating in-space plasma; neutralizing plumes; functioning as the cathode for noble gas, hydrogen, and other discharges. Additionally, cathodes function as the electron source for a variety of equipment that employ an ion beam, such as ion beam milling systems, scanning electron microscope (SEMs), transmission electron microscopes (TEMs), electron lithography systems, electron accelerators, x-ray sources, free electron lasers, accelerators, melting furnaces, and other standard and custom equipment. Cathode materials are generally heated to temperatures greater than 1000 degrees Celsius to produce sufficient light or electron emissions for a large range of applications. Many existing cathode assemblies operate at low efficiencies due to the high energies they require to heat the cathodes to sufficiently high temperatures. For many cathode applications, it is desirable that the cathode assembly is exposed directly to the environment, however, many existing cathode assemblies are prone to self-contamination, which destroys or severely reduces the cathode's emission portionabilities.

A typical cathode used in the art is the Vogel-mounted design 100, illustrated in FIG. 1, which supports an emitter material 102 with two curved support arms 104 rising from a base 106, each arm 104 supporting a pyrolytic carbon block heater 108 on the upper end such that the heaters 108 are in direct contact with the emitter material 102.

The Vogel-mounted design is advantageous in that the pyrolytic carbon block heater 108 provides for high resistance because of its perpendicular orientation with respect to direction of the electrical current. Additionally, the direct contact of the heater 108 to the emission material 102 allows for direct conduction of heat to the emission material, which results in greater thermal efficiency. Finally, the block heater design is more durable than a filament heater used in most cathode emitters. To provide a resistance with a filament heater similar to the level of the block heater, a filament would have to be extremely thin and fragile. Higher resistance cathode heaters are attractive since they reduce the current required to generate a given amount of heat power.

However, the Vogel-mounted design has several distinct disadvantages. Foremost is the loss of heat radiated into the environment from the exposed surfaces of the heater 108. The loss of heat decreases the efficiency of the cathode and consequently requires a higher power to achieve a desired level of emission. This heat loss also makes the Vogel-mounted design undesirable in situations where a large amount of heat emission cannot be tolerated. Additionally, the Vogel-mounted design is prone to self-contaminating due to evaporation and ion-bombardment of the base 106. With typical base materials such as ceramics and MACOR® (a high-temperature glass ceramic insulator made by Corning, Inc. of Corning, N.Y.), contaminants evaporate and sputter from the base 106 as it is eroded by ion-bombardment and contaminate the emitter surface 110 of the emission material 102. Contamination of the emitter surface results in a decrease in cathode efficiency or a complete loss of cathode emission. Another limitation of the Vogel-mounted design is its structural stability. Since the device is simply held in place by two freestanding, curved arms 104, the cathode is susceptible to slight external movement, vibration, and shock. The cathode assembly becomes increasingly more fragile with increased operating time.

Another common cathode design is the conventional aft heater design 200, illustrated in FIG. 2, which uses a filament-type heater 204 behind, but not in contact with, the emission material 202. The emission material 202 is supported by an aft assembly 206 that encloses the heater 204.

The aft-heater design is advantageous in that the design provides some mitigation of self-poisoning, as the heater 204 is essentially enclosed within the aft assembly 206 and potential contaminants, such as MACOR®, are not directly exposed to the emitter environment. Additionally, the design is more stable in that the structure does not rely on the horizontal pressure provided by two support arms (as with the Vogel-mounted cathode—see FIG. 1), but instead relies on a vertically-stacked design with one component supporting another.

The aft-mounted heater cathode has several disadvantages. As with the Vogel-mounted design, the entire cathode 200 is exposed directly to the environment, creating similar inefficiencies with regard to required energy and superfluous heat radiation. Only the portion of the heater 204 surrounded by the aft assembly 206 prevents heat from radiating to the environment. Additionally, the heater 204 is a filament heater, which requires high current to achieve a desired heat in comparison with the block heater in the Vogel-mounted cathode. Furthermore, as the heater 204 is not in direct contact with the emission material 202, the thermal efficiency of the design is much less than that of the Vogel-mounted design.

As with the aforementioned designs, most cathodes require a high current to overcome the inefficiencies described above. Heat radiating into the environment from exposed heaters and the lack of direct contact between a heater and emission material are the primary sources of cathode inefficiency. Consequently, many cathode designs cannot be used with applications that require low power and low heat loss. Additionally, the potential for self-contamination of the emitting surface of the emission material in certain environments, such as plasma discharges, also significantly limits the lifespan, efficiency, and usefulness of many cathode technologies. Finally, the fragile nature of many cathodes with thin heaters and weak support structures does not provide for a cathode that can survive the environmental stresses of applications outside the laboratory, such as the mechanical shocks and vibrations experienced by space equipment during launch, or by a portable cathode emitter device during transport.

Therefore, a need exists in the art for a cathode that minimizes heat loss with a thermally efficient design so as to require minimal energy and provide maximum efficiency. Additionally, a need exists for a cathode that is not prone to self-contamination to assure an extended lifespan and high efficiency throughout the life of the cathode. Finally, a need exists for a durable cathode with these properties that is designed to withstand environmental stresses and the harsh conditions of cathode operation.

SUMMARY OF THE INVENTION

The present invention relates to an internally heated cathode. More specifically, the internally heated cathode that comprises an a cavity structure, where at least a portion of the cavity structure forms an emission material portion, the cavity structure defining a cavity, and a heater disposed within the cavity, providing for an efficient, durable, and long lasting cathode that requires less power.

In one aspect of the invention, an internally heated cathode comprises a cavity structure, where at least a portion of the cavity structure is formed as an emission material portion, the cavity structure defining a cavity; a heater disposed within the cavity; and an internal lead conductively connecting a power source with the heater.

In another aspect of the invention, the emission material portion is formed of a high-temperature thermionic emission material.

In another aspect of the invention, the high-temperature thermionic emission material portion is selected from a group consisting of: lanthanum hexaboride, cerium hexaboride, and zirconium carbide.

In another aspect of the invention, the heater is a pyrolytic graphite block heater.

In another aspect of the invention, the heater is in direct contact with the emission material portion.

In another aspect of the invention, the cathode comprises a conductive material disposed on a portion of the surface of the heater such that only the conductive material is in direct contact with the emission material portion.

In another aspect of the invention, the cavity structure further comprises a protective covering connected with the emission material portion.

In another aspect of the invention, the cathode comprises a washer between the emission material portion and the protective covering.

In another aspect of the invention, the washer is a material compatible with the emission material portion and the protective covering or heater material, and where the material of the protective covering and the material of the emission material portion are materially incompatible.

In another aspect of the invention, the cavity structure further comprises a base connected with the protective.

In another aspect of the invention, the base is formed of a conductive material.

In another aspect of the invention, the cavity structure further comprises an inlet for the internal lead.

In another aspect of the invention, the cathode comprises outlet holes formed in the cavity structure and connecting the cavity with an external environment.

In another aspect of the invention, reactant byproducts are removed from the cavity through the outlet holes.

In another aspect of the invention, the cathode comprises a spring disposed in the cavity structure between the base and the heater, positioned such that the spring urges the internal lead into the heater.

In another aspect of the invention, the spring is the internal lead connecting the power source to the heater.

In another aspect of the invention, the spring is the heater disposed within the emission material portion.

In another aspect of the invention, the cathode further comprises a spring support connected with the spring, positioned between the spring and the heater.

In another aspect of the invention, the spring support is a non-conductive material.

In another aspect of the invention, the spring support is MACOR®.

In another aspect of the invention, the heater is in direct contact with the emission material portion.

In another aspect of the invention, the cathode further comprises a compatible, conductive material disposed on a portion of the surface of the heater such that only the conductive material is in direct contact with the emission material portion.

In another aspect of the invention, the cathode further comprises a washer between the interface of the emission material portion and the protective covering.

In another aspect of the invention, the protective covering is a material incompatible with the emission material portion.

In another aspect of the invention, the washer is a material compatible with the emission material portion and the protective covering or heater material, and where the material of the protective covering and the material of the emission material portion are materially incompatible.

In a method, each of the aforementioned components may be provided to form an internally heated cathode.

BRIEF DESCRIPTION OF THE DRAWINGS

The objects, features and advantages of the present invention will be apparent from the following detailed descriptions of the preferred aspects of the invention, taken in conjunction with reference to the following drawings, where:

FIG. 7A is an illustration of an internally heated cathode with a base connected with the protective covering in accordance with the present invention;

FIG. 9D is an illustration of an internally heated cathode with a spring support disposed between the spring and the heater in accordance with the present invention.

DETAILED DESCRIPTION

Figure 1:
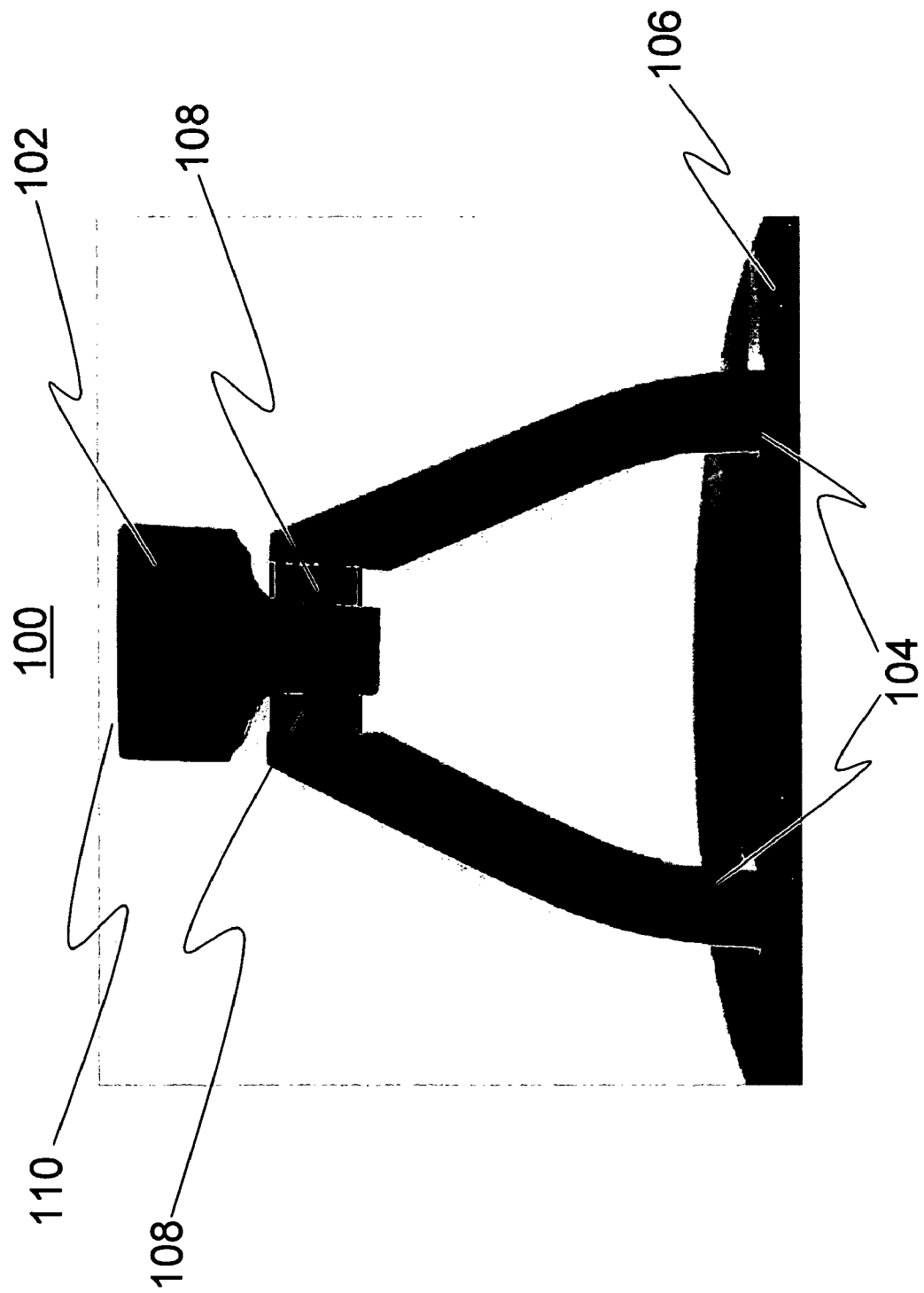
FIG. 1 is a prior art illustration of a Vogel-mounted cathode emitter.

The present invention relates to an internally heated cathode. More specifically, the internally heated cathode comprises an emission material portion with a cavity formed underneath, the cavity enclosing a heater. The following description, taken in conjunction with the referenced drawings, is presented to enable one of ordinary skill in the art to make and use the invention and to incorporate it in the context of particular applications. Various modifications, as well as a variety of uses in different applications, will be readily apparent to those skilled in the art and the general principles, defined herein, may be applied to a wide range of aspects. Thus, the present invention is not intended to be limited to the aspects presented, but is to be accorded the widest scope consistent with the principles and novel features disclosed herein. Furthermore, it should be noted that unless explicitly stated otherwise, the figures included herein are illustrated diagrammatically and without any specific scale, as they are provided as qualitative illustrations of the concept of the present invention.

(1) Introduction

The description outlined below sets forth an internally heated cathode, the cathode comprising an emission material portion and a cavity formed thereunder. The cavity encloses a heater, and the heater is protected from the external environment and enclosed such that radiant heat is focused toward the emission material portion. The significance of the present invention is the disposition of the heater within a cavity, as well as the potential for the heater to be in direct contact with the emission material portion. The enclosed heater increases the efficiency of the cathode and requires less current to achieve a desired level of electron emission. Additionally, orientation of the heater within the cavity prevents the harmful byproducts from the cathode assembly that pose contamination risks to the emitter material environment from reacting with the emitter surface of the emitter material portion, thus prolonging the life of the cathode emitter. The heater is connected to an external power source via an internal lead, which provides current to the heater, and a separate current path may connect directly to the heater to complete the circuit. When the heater is in direct contact with the emission material portion, the current path may run through the heater to the emission material portion, after which the circuit is completed through the emission material portion and other parts of the cathode, to the power source.

In the following detailed description, numerous specific details are set forth in order to provide a more thorough understanding of the present invention. However, it will be apparent to one skilled in the art that the present invention may be practiced without being limited to these specific details. In other instances, well-known structures and devices are shown in block diagram form, rather than in detail, in order to avoid obscuring the present invention.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

(2) Discussion—Internally Heated Cathode

The internally heated cathode design allows for unprecedented improvements in cathode efficiency and lifespan. Most notably, the design minimizes superfluous heat radiation by placing the heater within a cavity formed underneath the emission material portion. A majority of the heat generated by the heater is trapped within the cavity and radiates efficiently to the emission material portion, increasing the efficiency of heat transfer and requiring less current to achieve a desired level of electron emission. If the heater is placed in direct contact with the emission material portion, heat will also transfer directly from the heater to the emission material portion, providing for additional heat transfer and efficiency in operation. This cathode is also durable in that the heater is protected within the cavity, and may be a block heater instead of a filament heater. The cathode offers additional advantages in that the cathode configuration prevents contamination of the emitting surface of the emission material portion by trapping harmful byproducts of the reaction within the interior of the cathode assembly.

Specifically, the internally heated cathode design offers advantages over existing Vogel-mounted and other externally heated cathodes because of the use of an internal heater for better efficiency, a durable structure for longer life, and a more self-contained design that minimizes self-contamination and prolongs the life of the cathode.

The internally heated cathode design is superior to the aft-mounted heater design because the heater can be a durable, high-resistance block heater, is enclosed within a cavity, and may be placed in direct contact with the emission material portion.

The use of a high-resistance block heater also allows the overall cathode assembly to be significantly smaller than typical high temperature cathodes, because a small block heater can provide equivalent resistance to a large filament heater. As a result of the high electrical resistance, a lower current can be used, making the cathode particularly suited for smaller, more portable applications, such as those in space. A smaller heater also allows for a reduction in the overall size of the cathode, thus minimizing heat loss area for the entire assembly, thus increasing overall efficiency.

Figure 3A:
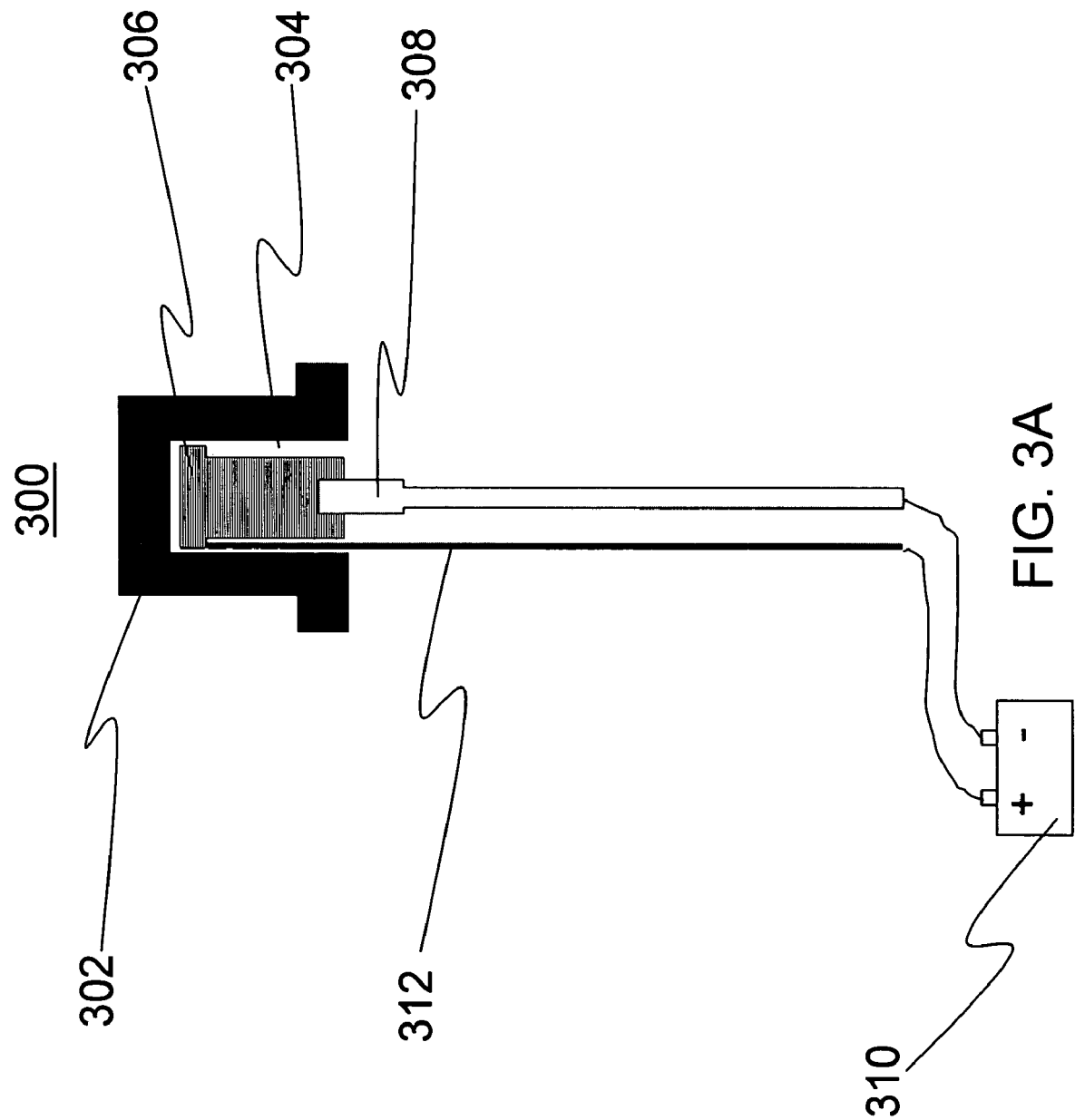
FIG. 3A is an illustration of an internally heated cathode wherein the heater is enclosed within a cavity formed by the emission material portion, in accordance with the present invention.

A non-limiting example of a design of an internally heated cathode 300 is illustrated in FIG. 3A. In this embodiment, the cathode includes of an emission material portion 302 with a cavity 304. A heater 306 is disposed substantially within the cavity 304 of the emission material portion 302. An internal lead 308 connects a power source 310 to the heater 306. The current path then runs through the internal lead 308, through the heater 306, and then exits the cathode through a current path 312. Heat radiates from the heater 306 and heats the emission material portion 302 to emit the desired concentration of light or electrons. In view of the fact that the emitter material portion 302 almost entirely encloses the heater, the heat transfer is extremely high.

Figure 3B:
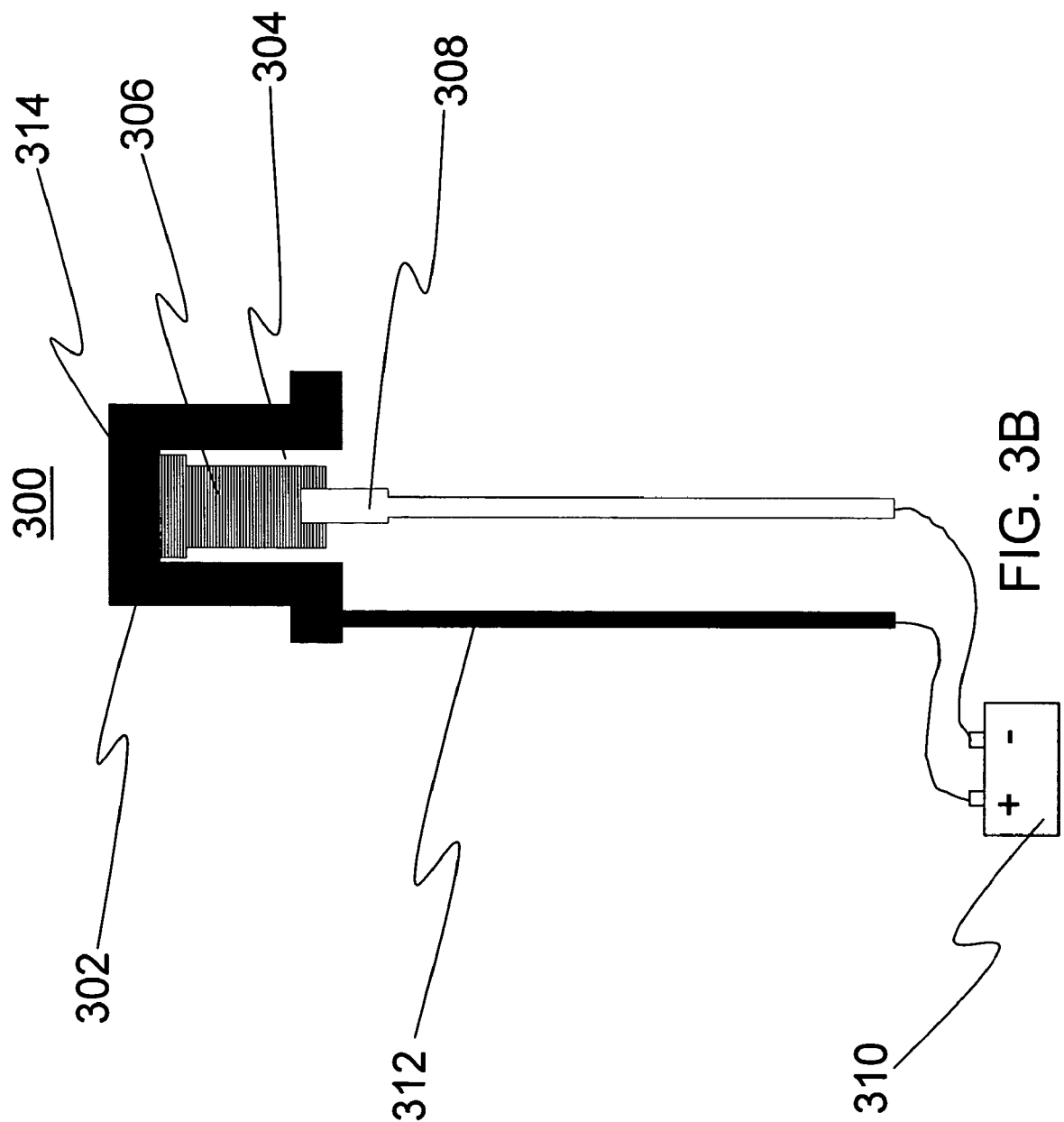
FIG. 3B is an illustration of the internally heated cathode where the heater is in direct contact with the emission material portion in accordance with the present invention.

The heater 306 may be in direct contact with the emission material portion 302 layer in a variety of ways, one of which is depicted in FIG. 3B, with the entire upper surface 314 of the heater 306 in direct contact with the emission material portion 302. This method of connectivity provides a desirable resistance across the entire upper surface 314 of the heater 306 in contact with the emission material portion 302. The current path then runs through the internal lead 308, through the heater 306 into the emission material portion 302, and then exits the cathode through a current path 312.

Figure 3C:
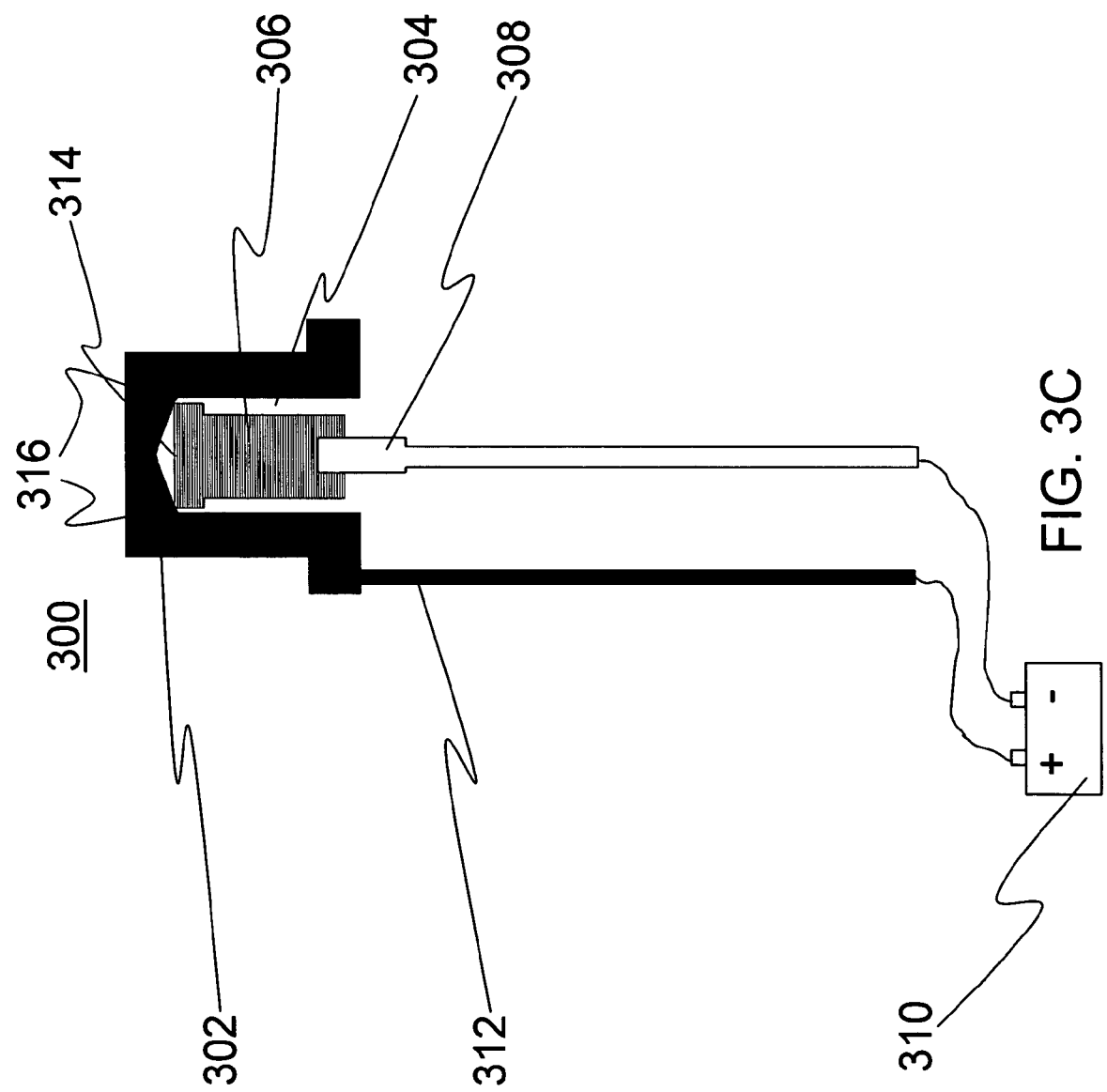
FIG. 3C is an illustration of the internally heated cathode where the emission material portion contacts only a small portion of the heater in accordance with the present invention.

FIG. 3C illustrates an alternate shape of the emission material portion 302. The emission material portion 302 may be reshaped to provide small areas of connectivity between the emission material portion 302 and the heater 306. In this depiction, the upper surface 314 of the heater contacts the emission material portion at an interface 316. This method of connectivity provides greatly increased resistance since the contact resistance is greatly increased at the small interface 316. This design may be beneficial in applications where a high electron emission is desired with only a minimal amount of heater current.

Figure 3D:
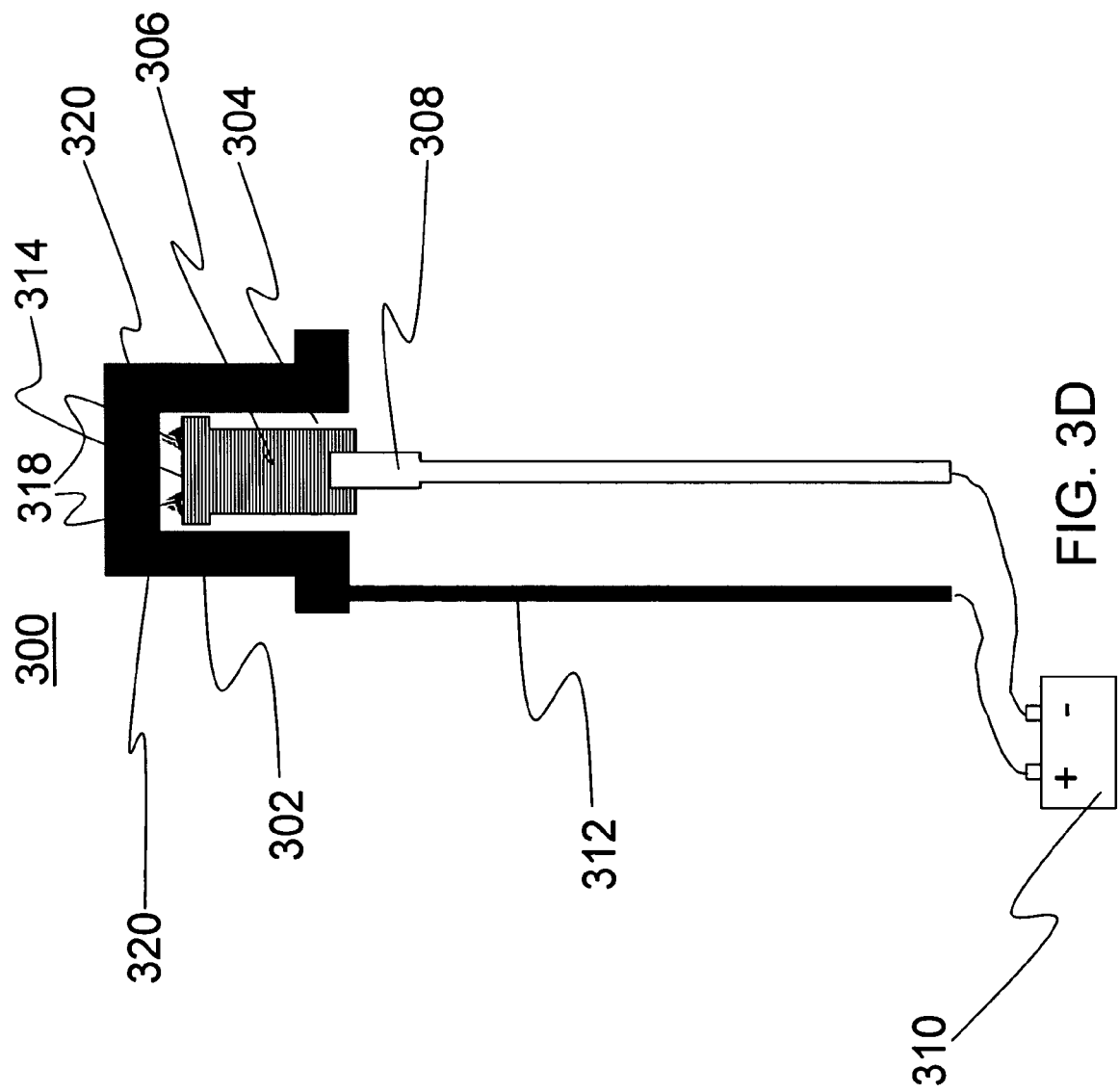
FIG. 3D is an illustration of the internally heated cathode where two conductive materials are between, and in contact with, the heater and emission material, in accordance with the present invention.

Additionally, FIG. 3D demonstrates another method of connectivity between the emission material portion 302 and the heater 306, wherein two electrically conductive materials 318 are placed or constructed between the heater 306 and the emission material portion 302. This creates a small interface 320 between the heater 306 and the emission material portion 302, where the resistance is greatly increased.

The emission material portion 302 may consist of lanthanum hexaboride, cerium hexaboride, zirconium carbide, or any preferable material, depending on the required output of electrons or light, the desired emitter properties, and the application of the cathode. In one embodiment, lanthanum hexaboride is used, as it provides a low work function (high electron output per unit temperature) and is durable at high temperatures. One skilled in the art will appreciate that a limitation of lanthanum hexaboride is compatibility. Few materials (such as carbon and rhenium) are compatible component materials with lanthanum hexaboride at high temperatures. Placing an incompatible material in contact with lanthanum hexaboride will cause the boron to diffuse into the complimenting material, creating a powder that will significantly decrease the life of the cathode.

The shape and size of the emission material portion may be changed depending on the requirements of the specific application. For example, the shape and size can be altered depending on the required electron emission or brightness requirements of the emission. Additionally, the shape of the emission material portion can be changed to provide for various connections to the heater, as illustrated above in FIG. 3C.

The internal lead 308 in FIGS. 3A-3D may be comprised of any conducting material, and the thickness and specific composition depends upon the requirements of the specific application. In one embodiment, the internal lead is made of a high temperature conductor such as molybdenum and is sufficiently thin to minimize heat conduction away from the heater.

The current path 312 may be completed using any conducting material that is compatible with the selected emission material portion 302. In one embodiment, the commonly selected material for a high temperature application with a lanthanum hexaboride emission material portion is carbon. If the heater 306 is not in direct contact with the emission material portion 302, as shown in FIG. 3A, the current path runs directly from the heater 306 back to the power source 310. If the heater 306 is in direct contact with the emission material portion 302, as shown in FIG. 3B, the current path 312 can be completed through any conductive material connected with the emission material portion 302.

The power source 310, as illustrated in FIG. 3A, may be located external to or within the cathode 300, depending upon the specific application and power requirements. As the present invention requires less power to provide a desired level of electron emission, a power source small enough to fit within the cathode is possible.

Figure 4:
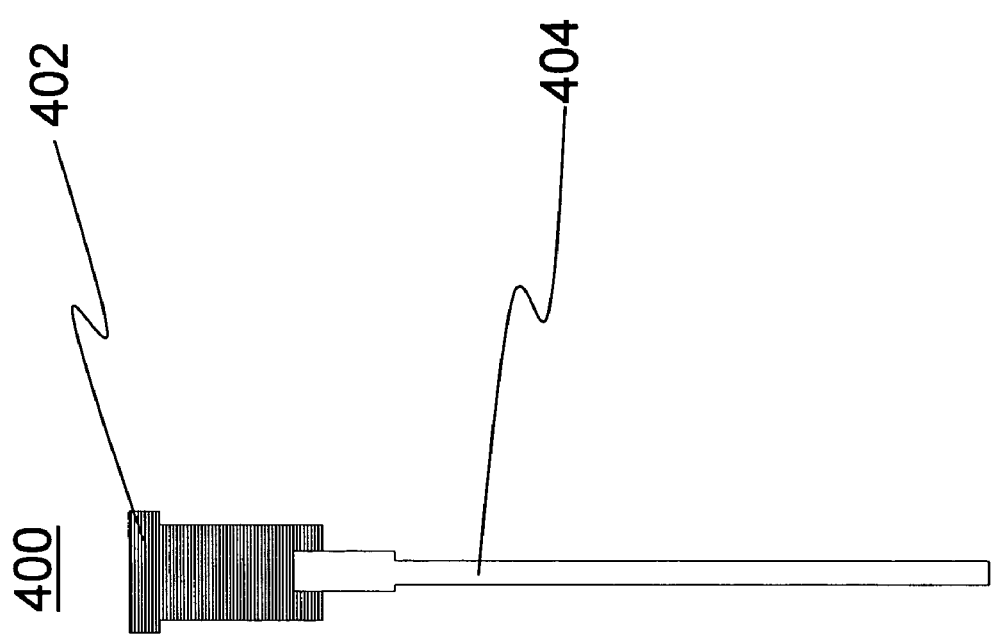
FIG. 4 is an illustration of a pyrolytic graphite heater depicting the graphite layers in accordance with the present invention.

The heater may comprise any shape or size and be any applicable heating device, depending on the application of the cathode. For a high temperature, high emission application, one embodiment provides a pyrolytic graphite heater, as illustrated in FIG. 4, wherein the heater 400 is constructed of pyrolytic graphite, which contains multiple layers 402 of graphite stacked horizontally. The current is passed from the internal lead 404 through the heater 400 perpendicular to the graphite layers 402. The resistance of pyrolytic graphite is inherently anisotropic such that the resistance perpendicular to the graphite layers is several orders of magnitude greater than along the layers. Consequently, pyrolytic graphite provides desirably high resistance for heater applications. The total heater resistance can be increased by increasing the length of the heater, decreasing the diameter of the heater, segmenting the heater, or narrowing a portion of the heater and effectively "necking" the electrical current.

Figure 5A:
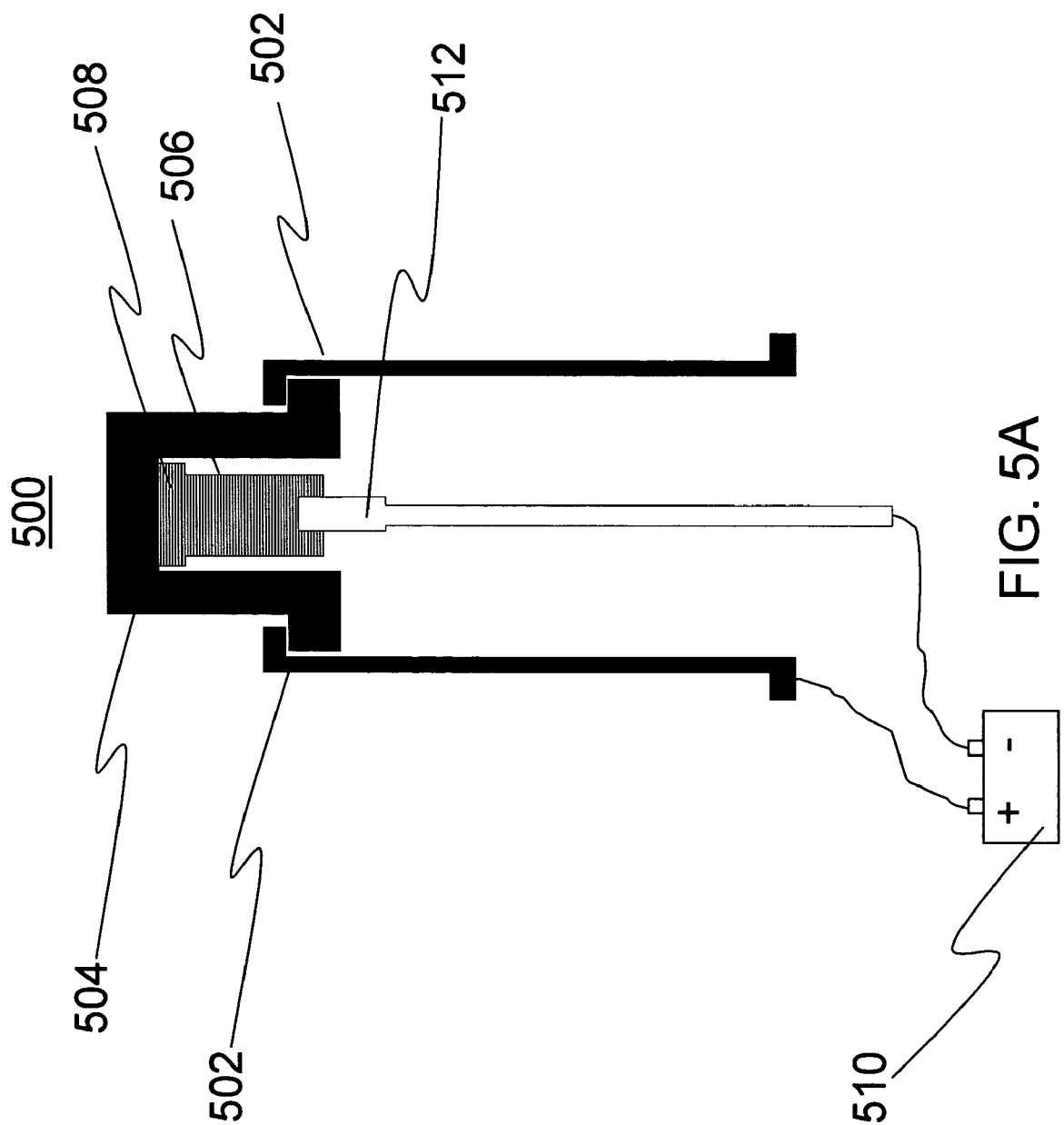
FIG. 5A is an illustration of an internally heated cathode with a protective covering forming a cavity in accordance with the present invention.

In one aspect of the invention, as illustrated in FIG. 5A, a protective covering 502 is connected with the emission material portion 504 and forms a cavity 506 underneath the emission material portion 504. In this aspect, the protective covering 502 may act to complete the current path to the power source 510 traveling from the internal lead 512 through the heater 508 and into the emission material portion 504. However, if the heater 508 is not in direct contact with the emission material portion 504, the current path will simply pass through the heater 508 and return through a separate path (not shown) to the power source 510. The protective covering 502 also provides for greater containment of heat, increasing the efficiency of the cathode 500 and providing significant structural stability. One skilled in the art will appreciate that this embodiment is also advantageous for applications where the heat and/or byproducts of the reaction are harmful to the external environment, as the protective covering 502 prevents harmful reaction byproducts from esportioning the cavity 506 and coating the emitter surface of the emission material portion 504.

The protective covering 502 may be any conducting material depending on the specific application. In one embodiment, carbon is used, as carbon at high temperatures is a compatible material with popular emitter materials such as lanthanum hexaboride.

As discussed briefly above, the emission material portion 504 can be any shape, depending on the specific application of the cathode 500. With a protective covering 502 forming a cavity 506, the emission material portion 504 can take a flat shape, as illustrated below. Additionally, the emission material portion 504 can be shaped on its upper surface to provide for specific applications such as those for electron microscopes, where a narrow tip is typically desired to focus the electron emission in a single direction and increase the concentration of emission at one point.

Figure 5B:
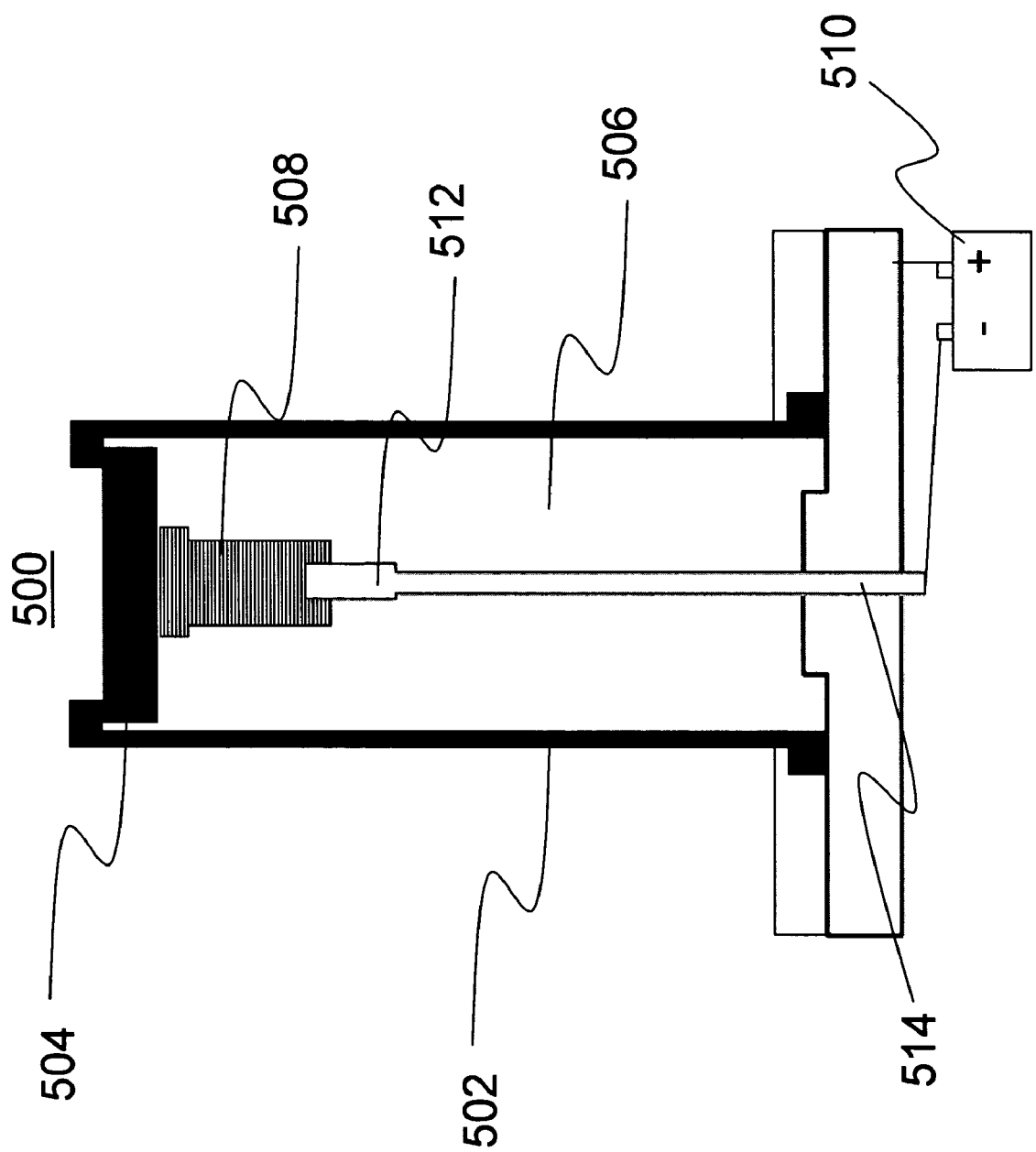
FIG. 5B is an illustration of an internally heated cathode with a protective covering forming a cavity and a flat emitter material portion, in accordance with the present invention.

A non-limiting example of a design of the internally heated cathode 500 is presented in FIG. 5B. In this embodiment, the emission material portion 504 has a flat shape and is connected with a protective covering 502 to form a cavity 506. A heater 508 is disposed within the upper portion of the cavity 506 next to the emission material portion 504. An internal lead 512 passes through a small opening 514 in the protective covering 502 and connects the heater 508 with an external power source 510. As with previous embodiments, the heater 508 may be in direct contact with the emission material portion 504, depending on the particular materials used, the power available, and the desired electron output.

With this embodiment, the heater 508 is protected from the external environment by the protective covering 502, and heat emanating from the heater 508 will be trapped within the cavity 506 and will conduct and radiate upward to the emission material portion 504.

Figure 6:
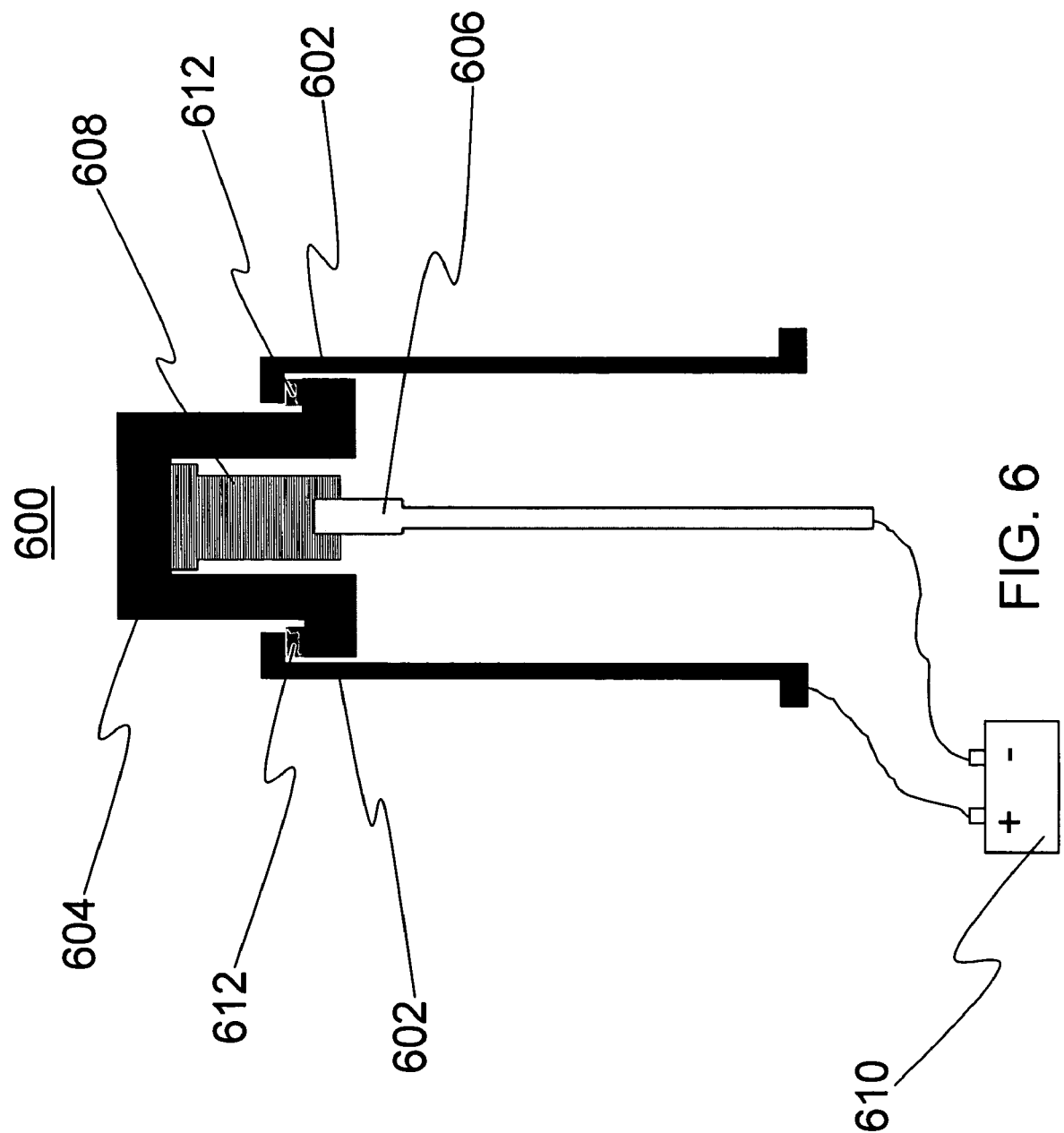
FIG. 6 is an illustration of an internally heated cathode with a washer placed between the interface of the emission material portion and the protective covering in accordance with the present invention.

In another aspect, as illustrated in FIG. 6, a washer 612 is placed between the interface of the emission material portion 604 and the protective covering 602. The washer 612 allows for the materials comprising the protective covering 602 to be incompatible with the materials comprising the emission material portion 604 by bridging the connection with a compatible, conductive material. The washer 612 completes the current path between the emission material portion 604 and the protective covering 602. In this embodiment, any suitable material can be chosen for both the emission material portion 604 and the protective covering 602, irrespective of the compatibility of the two, by choosing a mutually compatible washer material. In one embodiment, a carbon washer 612 is used to connect with a lanthanum hexaboride emission material portion 604 and a protective covering 602 made from molybdenum. This embodiment provides further durability and lifespan for the cathode, because eliminating a connection between incompatible materials will prevent buildup of materials that degrade the efficiency of the cathode.

Figure 7B:
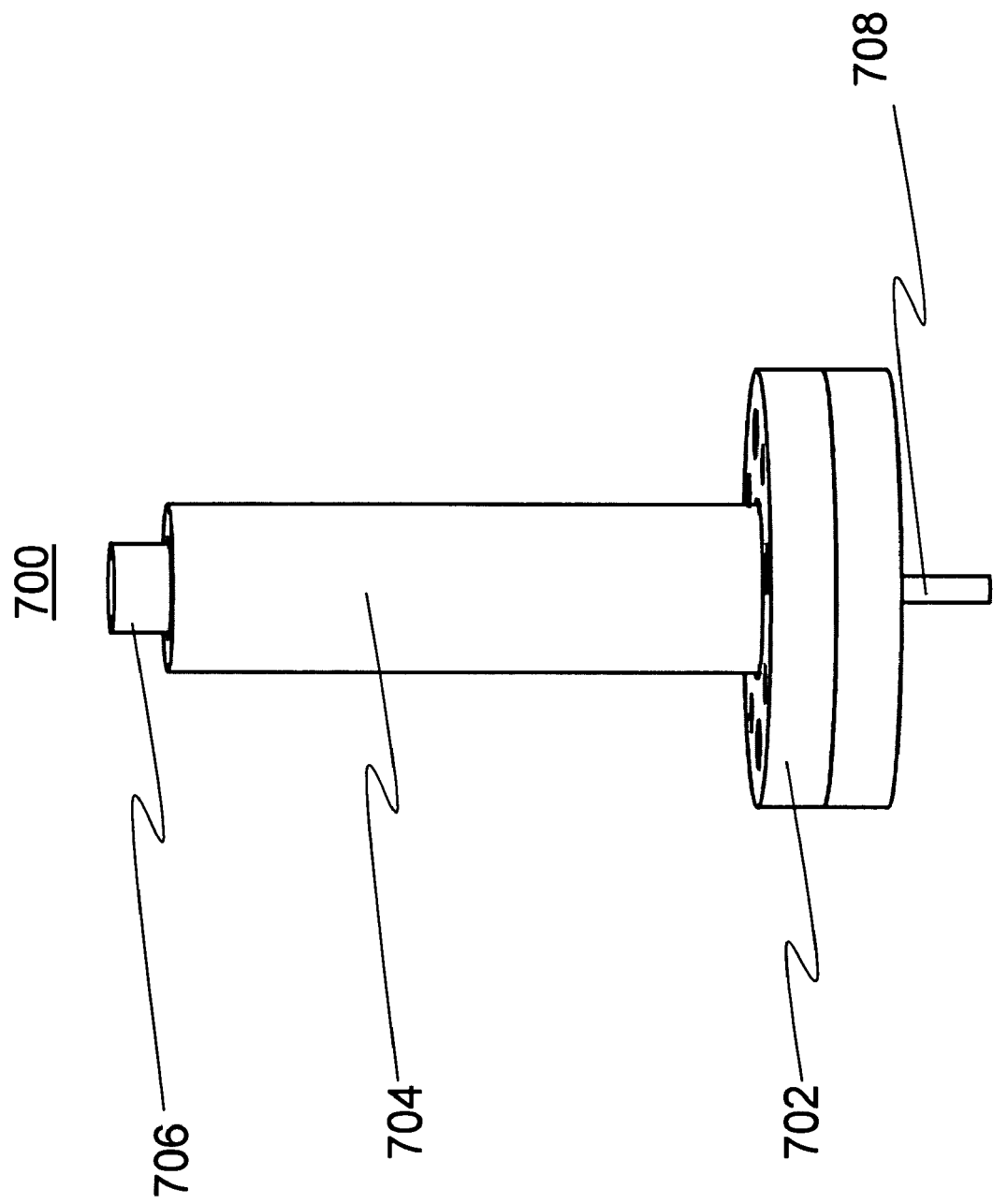
FIG. 7B is a three-dimensional illustration of the internally heated cathode in accordance with the present invention.

In still another aspect, as illustrated in FIG. 7A, a base 702 is provided for the cathode 700, which connects with the protective covering 704 and forms a completely enclosed cathode 700. The base 702 allows the cathode 700 to be mounted to various surfaces and provides support for components in further embodiments of the invention. The base 702 can be any desirable material depending upon the specific application, and in one embodiment, carbon is used. Additionally, the base 702 can be a conductive material and provide for an additional link in the current path from the protective covering 704 to the power source. FIG. 7B is a three-dimensional illustration of this embodiment of the cathode 700, including the protective covering 704, the emission material portion 706, and the internal lead 708, demonstrating an axisymmetric design of the cathode 700.

Figure 8:
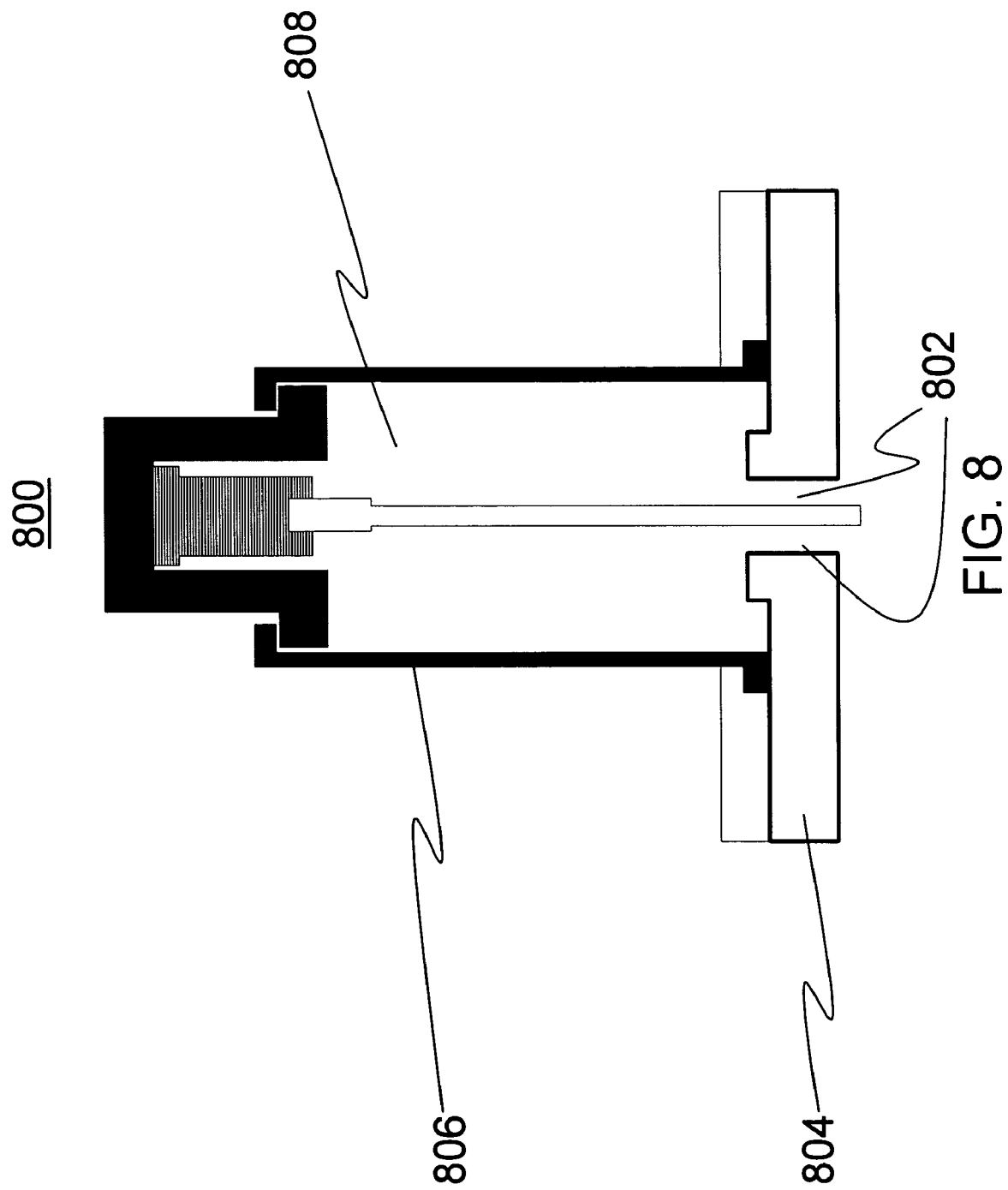
FIG. 8 is an illustration of an internally heated cathode with two holes in the protective covering for vacuum relief in accordance with the present invention.

In yet another aspect, as illustrated in FIG. 8, ventilation holes 802 are provided in the base 804 of the cathode 800 to evacuate unwanted materials from the cavity 808. The removal of unwanted materials is achieved through vacuum relief, which forcibly removes the materials through the ventilation holes 802. The ventilation holes may be formed within the base 804 or the protective material 806, depending on the specific application of the cathode.

Figure 9A:
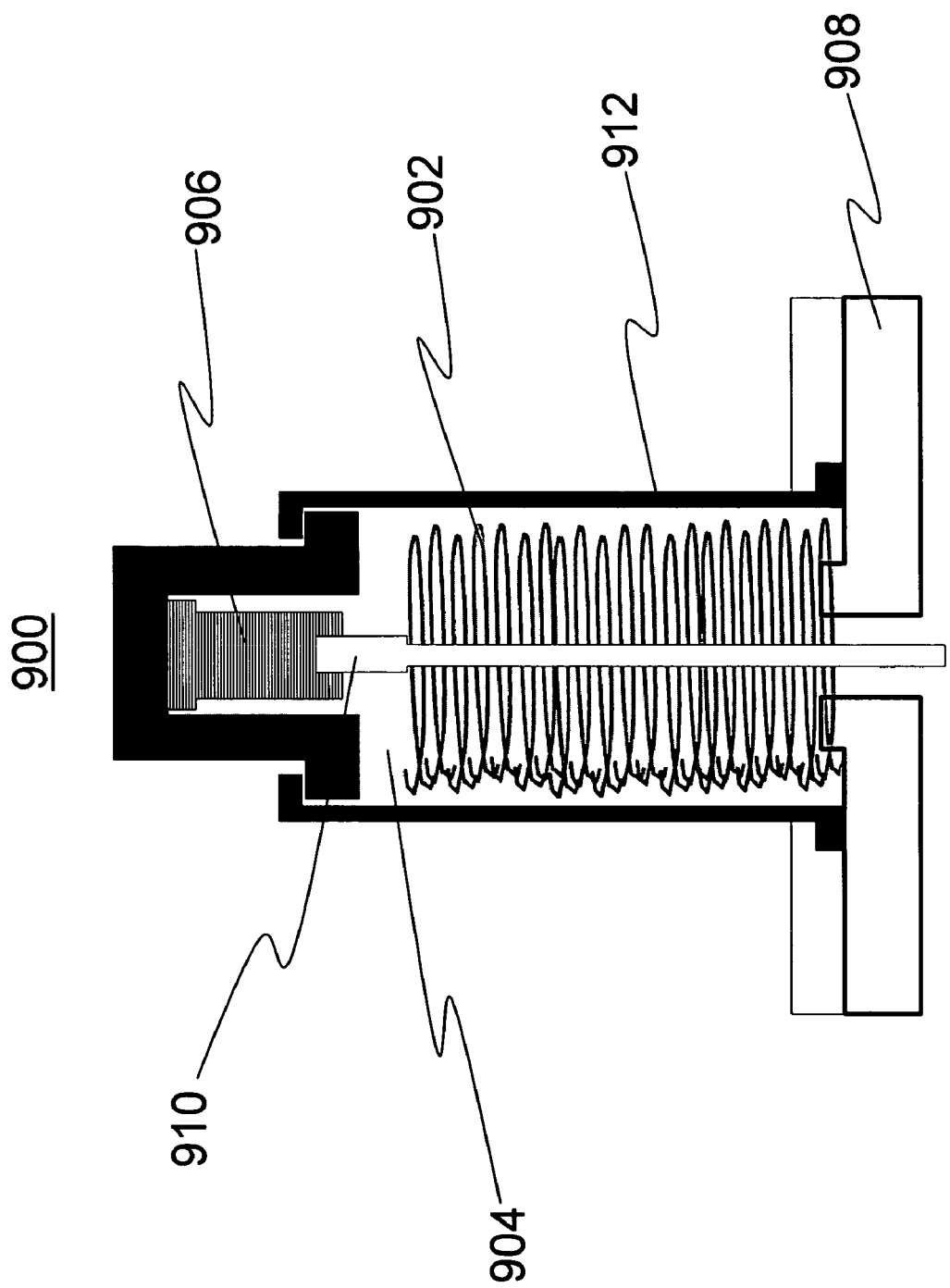
FIG. 9A is an illustration of an internally heated cathode with a spring disposed between the base and the heater in accordance with the present invention.

In another aspect, as illustrated in FIG. 9A, a spring 902 is provided within a cavity 904 of the cathode 900, placed between the heater 906 and the base 908. The spring 902 surrounds the internal lead 910 and acts to maintain the connection of the internal lead 910 to the heater 906 and to allow for the heat expansion of all materials within the cathode 900. The spring 902 can be made of any appropriate material depending on the specific application and required durability. For high-temperature applications, the spring 902 can be made from high temperature materials such as carbon, molybdenum, molybdenum-rhenium, or tungsten. However, in the embodiment presented in FIG. 9A, where the spring 902 is in direct contact with the internal lead 910, the spring 902 may be formed from a non-conductive material to prevent a short from occurring between the internal lead 910 and the protective covering 912, or insulating materials can be used to prevent such shorts.

Figure 9B:
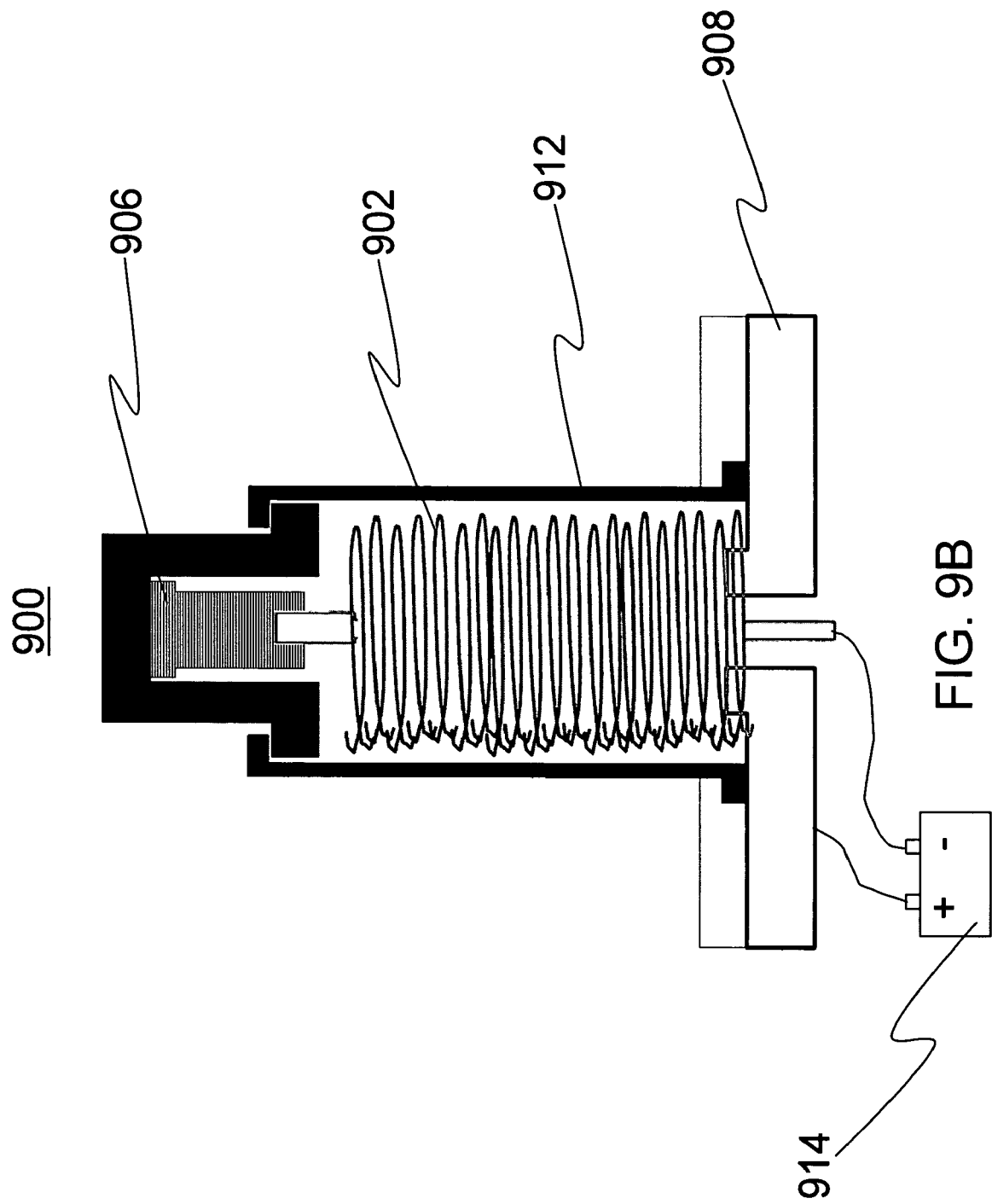
FIG. 9B is an illustration of an internally heated cathode with the spring functioning as an internal lead in accordance with the present invention.

The spring can also act as the internal lead, as depicted in FIG. 9B. In this embodiment, the spring 902 is a conductive material that carries the current path from the power source 914 to the heater 906. This design eliminates the need for a separate internal lead within the cathode 900, requiring only the spring 902 to provide current and maintain the connection with the heater 906. In this embodiment, care must be taken to avoid electrical contact between the spring 902 and the protective covering 912 and/or base 908 so as to prevent a short in the electrical current.

Figure 2:
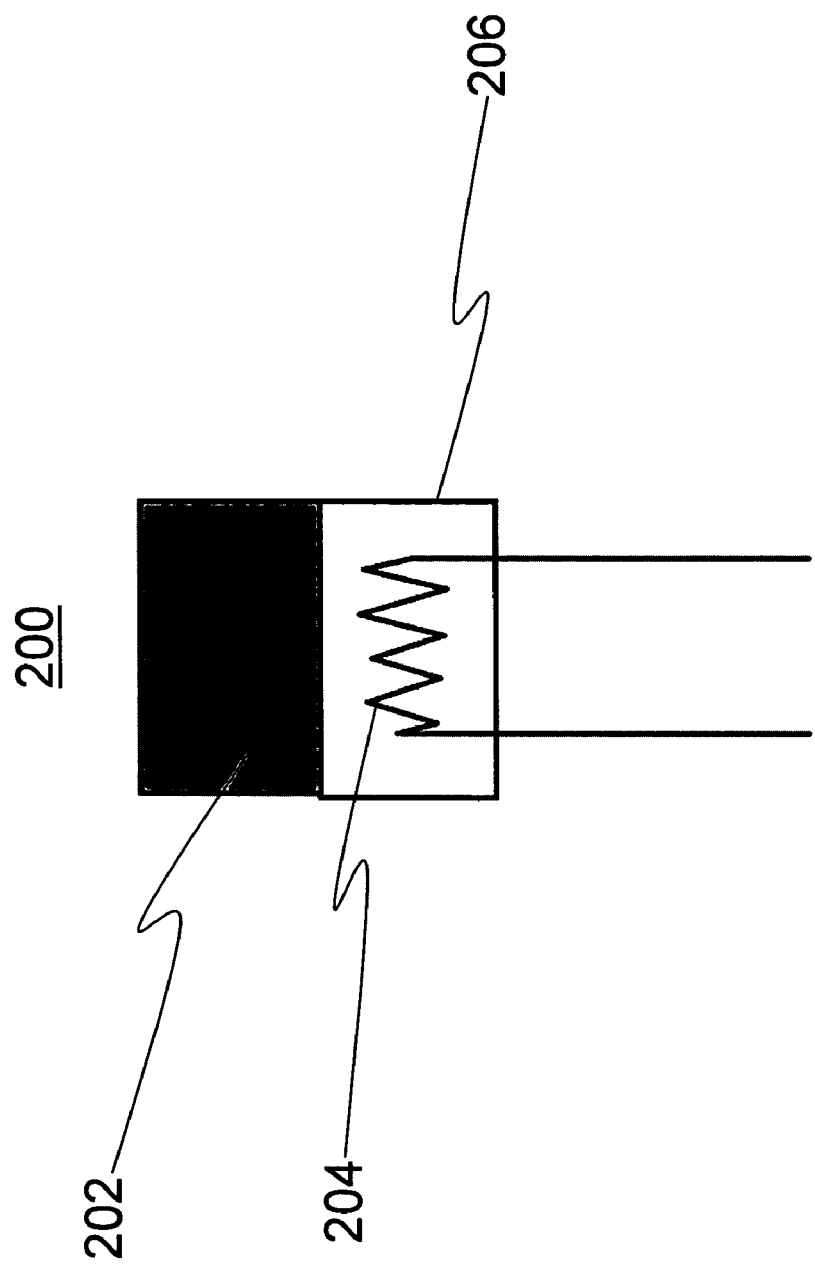
FIG. 2 is a prior art illustration of an aft heater cathode emitter.
Figure 9C:
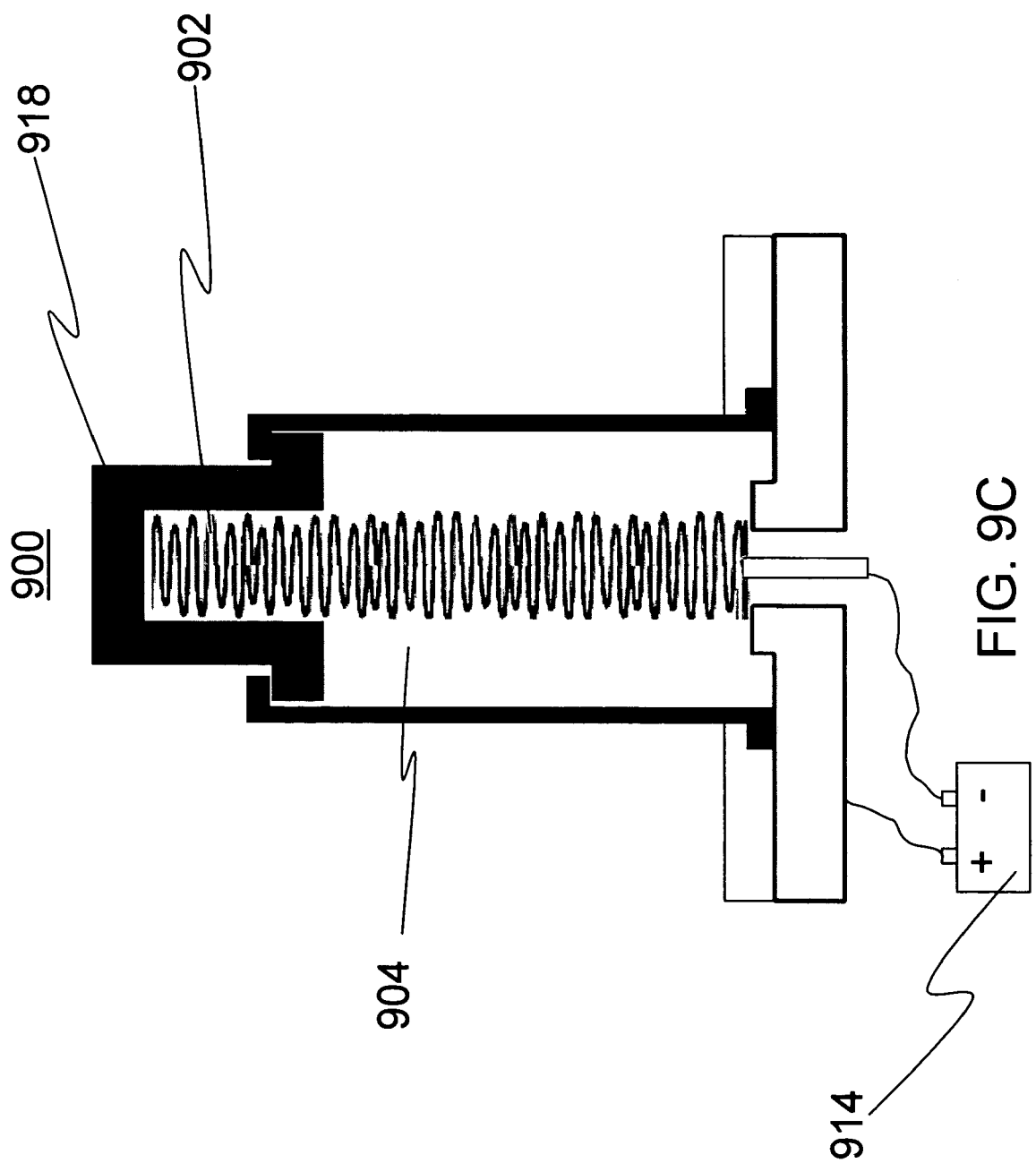
FIG. 9C is an illustration of an internally heated cathode with the spring functioning as a heater disposed within the emission material portion cavity in accordance with the present invention.

In another embodiment, the spring 902 can act as the heater, as illustrated in FIG. 9C. The spring 902 creates high resistance as the current travels through the narrow, lengthy coils of the spring 902, and radiates considerable heat. If placed within the cavity 904 defined by the emission material portion 918, the cathode functions with increased efficiency without the need for a separate heater and spring. The spring 902 also acts to maintain a direct connection between the spring 902 and the emission material portion 918, providing additional contact resistance at the connection points. In contrast with a block-shaped heater (see FIG. 2B), the smaller surface area of the spring 902 will create smaller contact points with the emission material portion 918, and thus provide high contact resistance.

In still another embodiment, as illustrated by FIG. 9D, a spring support 920 is placed between the interface of the spring 902 and the heater 906. The spring support 920 acts as a non-conducting buffer between the spring 902 and the internal lead 910, preventing an electrical short and mechanically maintaining the connection of the internal lead 910 with the heater 906. In one embodiment, the spring support 920 is a disc-shaped insulating material such as MACOR®.

What is claimed is:

1. An internally heated cathode comprising:
   a cavity structure, where at least a portion of the cavity structure is formed as an emission material portion, the cavity structure defining a cavity;
   a heater disposed within the cavity in direct contact with the emission material portion, wherein the heater is a pyrolytic graphite block heater comprising a plurality of layers of graphite stacked horizontally; and
   an internal lead conductively connecting a power source with the heater, wherein a spring surrounds the internal lead and acts to maintain the connection of the internal lead to the heater and allow for the heat expansion of all materials of the internally heated cathode.

2. An internally heated cathode according to claim 1, wherein the emission material portion is formed of a high-temperature thermionic emission material.

3. An internally heated cathode according to claim 2, wherein the high-temperature thermionic emission material portion is selected from a group consisting of: lanthanum hexaboride, cerium hexaboride, and zirconium carbide.

4. An internally heated cathode according to claim 1, wherein the heater is in direct contact with the emission material portion.

5. An internally heated cathode according to claim 1, further comprising a conductive material disposed on a portion of the surface of the heater such that only the conductive material is in direct contact with the emission material portion.

6. An internally heated cathode according to claim 1, wherein the cavity structure further comprises a protective covering connected with the emission material portion.

7. An internally heated cathode according to claim 6, further comprising a washer between the emission material portion and the protective covering.

8. An internally heated cathode according to claim 7, wherein the washer is a material compatible with the emission material portion and the protective covering or heater material, and where the material of the protective covering and the material of the emission material portion are materially incompatible.

9. An internally heated cathode according to claim 6, wherein the cavity structure further comprises a base connected with the protective covering.

10. An internally heated cathode according to claim 9, wherein the base is formed of a conductive material.

11. An internally heated cathode according to claim 9, wherein the cavity structure further comprises an inlet for the internal lead.

12. An internally heated cathode according to claim 9, further comprising outlet holes formed in the cavity structure and connecting the cavity with an external environment.

13. An internally heated cathode according to claim 12, wherein reactant byproducts are removed from the cavity through the outlet holes.

14. An internally heated cathode according to claim 1, wherein the spring is the internal lead connecting the power source to the heater.

15. An internally heated cathode according to claim 1, wherein the spring is the heater disposed within the emission material portion.

16. An internally heated cathode according to claim 1, further comprising a spring support connected with the spring, positioned between the spring and the heater.

17. An internally heated cathode according to claim 16, wherein the spring support is a non-conductive material.

18. An internally heated cathode according to claim 17, wherein the spring support is an insulating material.

19. An internally heated cathode comprising:
a cavity structure, where at least a portion of the cavity structure forms an emission material portion, the cavity structure defining a cavity;
a heater disposed within the cavity, wherein the heater is pyrolytic graphite block heater comprising a plurality of layers of graphite stacked horizontally;
an internal lead conductively connecting a power source with the heater;
the cavity structure further comprising a protective covering connected with the emission material portion;
the cavity structure further comprising a base connected with the protective covering;
outlet holes formed in the cavity structure and connecting the cavity with the external environment;
a spring disposed in the cavity structure between the base and the heater, positioned such that the spring urges the internal lead into the heater, wherein the spring surrounds the internal lead and acts to maintain the connection of the internal lead to the heater and allow for the heat expansion of all materials of the internally heated cathode; and
a spring support disposed between the spring and the heater, positioned such that the spring is prevented from contacting the internal lead.

20. An internally heated cathode according to claim 19, wherein the heater is in direct contact with the emission material therein.

21. An internally heated cathode according to claim 19, further comprising a compatible, conductive material disposed on a portion of the surface of the heater such that only the conductive material is in direct contact with the emission material portion.

22. An internally heated cathode according to claim 21, further comprising a washer between the interface of the emission material portion and the protective covering.

23. A method for forming an internally heated cathode, the method comprising the steps of:
forming a cavity structure, where at least a portion of the cavity structure is formed as an emission material portion, the cavity structure defining a cavity;
forming a heater disposed within the cavity in direct contact with the emission material portion, wherein the heater is a pyrolytic graphite block heater comprising a plurality of layers of graphite stacked horizontally;
forming an internal lead conductively connecting a power source with the heater; and
forming a spring to surround the internal lead which acts to maintain the connection of the internal lead to the heater and allow for the heat expansion of all materials of the internally heated cathode.

24. An internally heated cathode according to claim 23, wherein the washer is a material compatible with the emission material portion and the protective covering or heater material, and where the material of the protective covering and the material of the emission material portion are materially incompatible.

25. An internally heated cathode according to claim 24, wherein the protective covering is a material incompatible with the emission material portion.

26. A method for forming an internally heated cathode according to claim 23, wherein the emission material portion is formed of a high-temperature thermionic emission material.

27. A method for forming an internally heated cathode according to claim 23, wherein the high-temperature thermionic emission material portion is selected from a group consisting of: lanthanum hexaboride, cerium hexaboride, and zirconium carbide.

28. A method for forming an internally heated cathode according to claim 23, wherein the heater is in direct contact with the emission material portion.

29. A method for forming an internally heated cathode as set forth in claim 23,
wherein the act of forming the internally heated cathode further comprises an act of
forming a conductive material on a portion of the surface of the heater such that only the conductive material is in direct contact with the emission material portion.

30. A method for forming an internally heated cathode according to claim 23, wherein the cavity structure further comprises a protective covering connected with the emission material portion.

31. A method for forming an internally heated cathode according to claim 30, further comprising a washer between the emission material portion and the protective covering.

32. A method for forming an internally heated cathode according to claim 31, wherein the washer is a material compatible with the emission material portion and the protective covering or heater material, and where the material of the protective covering and the material of the emission material portion are materially incompatible.

33. A method for forming an internally heated cathode according to claim 30, wherein the cavity structure further comprises a base connected with the protective covering.

34. A method for forming an internally heated cathode according to claim 33, wherein the base is formed of a conductive material.

35. A method for forming an internally heated cathode according to claim 33, wherein the cavity structure further comprises an inlet for the internal lead.

36. A method for forming an internally heated cathode according to claim 33, further comprising outlet holes formed in the cavity structure and connecting the cavity with an external environment.

37. A method for forming an internally heated cathode according to claim 36, wherein reactant byproducts are removed from the cavity through the outlet holes.

38. A method for forming an internally heated cathode according to claim 23, wherein the spring is the internal lead connecting the power source to the heater.

39. A method for forming an internally heated cathode according to claim 23, wherein the spring is the heater disposed within the emission material portion.

40. A method for forming an internally heated cathode according to claim 23, further comprising a spring support connected with the spring, positioned between the spring and the heater.

41. A method for forming an internally heated cathode according to claim 40, wherein the spring support is a non-conductive material.

42. A method for forming an internally heated cathode according to claim 41, wherein the spring support is an insulating material.

43. A method for forming an internally heated cathode, the method comprising the steps of:
   forming a cavity structure, where at least a portion of the cavity structure forms an emission material portion, the cavity structure defining a cavity;
   a heater disposed within the cavity, wherein the heater is pyrolytic graphite block heater comprising a plurality of layers of graphite stacked horizontally;
   an internal lead connecting a power source with the heater;
   a protective covering connected with the emission material portion and substantially enclosing the cavity structure;
   a base connected with the protective covering and substantially enclosing the cavity structure;
   outlet holes connecting the cavity with the external environment;
   a spring disposed between the base and the heater, positioned such that spring pushes the internal lead into the heater, wherein the spring surrounds the internal lead and acts to maintain the connection of the internal lead to the heater and allow for the heat expansion of all materials of the internally heated cathode; and
   a spring support disposed between the spring and the heater, positioned such that the spring does not directly contact the internal lead.

44. A method for forming an internally heated cathode according to claim 43, wherein the heater is in direct contact with the emission material portion.

45. A method for forming an internally heated cathode according to claim 43, further comprising a compatible, conductive material disposed on a portion of the surface of the heater such that only the conductive material is in direct contact with the emission material portion.

46. A method for forming an internally heated cathode according to claim 43, further comprising a washer between the interface of the emission material portion and the protective covering.

47. A method for forming an internally heated cathode according to claim 46, wherein the washer is a material compatible with the emission material portion and the protective covering or heater material, and where the material of the protective covering and the material of the emission material portion are materially incompatible.

* * * * *